United States Patent [19]

Munikoti et al.

[11] Patent Number: 5,172,063
[45] Date of Patent: Dec. 15, 1992

[54] METHOD AND CIRCUIT FOR TESTING THE CONDUCTIVE CIRCUITRY OF A PRINTED CIRCUIT BOARD

[75] Inventors: Ramachandra Munikoti, Nepean; Pulak Dhar, Ottawa, both of Canada

[73] Assignee: Northern Telecom Limited, Montreal, Canada

[21] Appl. No.: 704,522

[22] Filed: May 23, 1991

[51] Int. Cl.$^5$ ............................................. G01R 31/02
[52] U.S. Cl. .................. 324/537; 324/158 R; 324/538
[58] Field of Search .................. 324/158 R, 537, 538, 324/73.1, 512, 513, 514

[56] References Cited
U.S. PATENT DOCUMENTS

| | | | |
|---|---|---|---|
| 3,859,711 | 1/1975 | McKiddy | 324/537 |
| 4,510,446 | 4/1985 | Braun et al. | 324/158 R |
| 5,006,808 | 4/1991 | Watts | 324/537 |

Primary Examiner—Ernest F. Karlsen
Attorney, Agent, or Firm—F. P. Turpin

[57] ABSTRACT

The reliability of conductive circuitry of a printed circuit board and particularly the integrity of the conductive barrels of the through-holes is tested by cyclically passing a current through a plurality of interconnected barrels. The current must be sufficient to resistively heat the conductive barrels to a temperature at which the glass epoxy substrate adjacent to each barrel reaches a transition temperature at which the glass epoxy changes state from a solid to a semi-solid. After sufficiently heating the glass epoxy, it is allowed to cool to ambient temperature. This cycle is repeated for a predetermined number of cycles and the resistance of the barrels is measured after each cycle. A measured resistance that exceeds a predetermined value indicates that one or more defects is present in the interconnected barrels.

7 Claims, 2 Drawing Sheets

METHOD AND CIRCUIT FOR TESTING THE CONDUCTIVE CIRCUITRY OF A PRINTED CIRCUIT BOARD

FIELD OF THE INVENTION

This invention relates to a test apparatus and method for assessing the reliability of printed circuit boards and more specifically that of plated through holes on printed circuit boards.

BACKGROUND OF THE INVENTION

Printed circuit boards (PCBs) have become increasingly complex in the last few years. Physical board dimensions and higher interconnect densities have required rigorous manufacturing and process controls on PCBs. Plated through holes (PTHs) have been an area of particular concern in the manufacture and reliability of PCBs.

Furthermore, a variety of new manufacturing processes such as surface mount technology, and wave soldering subject PCBs to increased thermal stresses which may have an adverse impact on plated through hole reliability.

In general, it has been found that the main cause of a PTH failure may be traced to significant differences in thermal expansion between the copper barrel lining the hole and the surrounding substrate. When the differential expansion causes strain that exceeds the strength of the copper barrel, a rupture intermediate its ends may develop due to thermal stresses. This usually results in open circuits or intermittent contacts which may lead to system failure.

In general, thermal shock or slow thermal cycling tests are employed to determine the capability of the PTHs to withstand cyclic temperature variations encountered in actual field life. Some of these are international standard tests as for example, IEC oil shock test, fluidized sand bath test, MIL-P55110 thermal shock test, MIL-STD-202 temperature cycling test, and APD-oil shock test. In these tests, the PCB specimens are subjected to temperature excursions from −65° C. to +125° C. or 25° C. to 260° C. at different rates of temperature changes. Changes in resistance of a series of interconnected plated holes beyond some arbitrary fixed value after a test is generally considered a failure.

In a study (IPC Round Robin) published September 1988 on reliability of small diameter holes, it was established that 400 cycles of MIL-T-thermal cycling, between −65° C. to +125° C., with 30 minutes of dwell time at each temperature extreme is the most discriminating test to distinguish between holes of good and poor reliability showing up both early life and wear out failures. Temperature cycling simulates the diurnal temperature variations experienced by the end product during a its field life. Failures occur when the fatigue life of the plated conducting barrel of a plated-through hole or that of a foil pad is exceeded.

Thermal cycling tests are time consuming, need elaborate chambers, and are often expensive to perform. In MIL-STD testing, the whole PCB specimen is uniformly heated to the desired temperature of 125° C. in a thermal chamber. Between 15-30 minutes are allowed for soaking and stabilization. In order to perform an adequate number of cycles this testing requires weeks to perform.

It is therefore an object of the invention to provide a method for testing the reliability of plated-through holes on a printed circuit board which is less time consuming and less expensive than the known methods of temperature cycling mentioned above.

SUMMARY OF THE INVENTION

The invention provides a method of testing the reliability of a PCB by applying to a predetermined plurality of serially connected PTHs on a sample coupon of the PCB a current which is sufficient to resistance heat the respective conductive barrel of each PTH to thereby a heat the surrounding substrate to a temperature adequate to effect a change of state in the substrate adjacent each hole in the series. A reliability determination is obtained by comparing an expected resistance value for the tested series of holes with a measured value.

In accordance with the invention, there is provided a method of assessing the reliability of the conductive circuitry of a PCB, the circuitry comprising plated copper barrels lining the inside surface of through holes and conductors interconnecting the barrels, the method comprising the steps of applying a current to a predetermined plurality of interconnected barrels, the current having a magnitude sufficient to resistively heat the barrels and their respective adjacent substrate to s a temperature at which the substrate will undergo a transition from a solid to a semi-solid; measuring the resistance value of the plurality of interconnected barrels; and comparing the measured resistance value with an expected value of resistance, a non-expected result of the comparison being indicative that a defect is present in one or more of the plated barrels.

From another aspect, the invention provides a circuit for assessing the reliability of the conductive circuitry of a PCB, the circuitry comprising plated copper barrels lining the inside surface of through holes and conductors interconnecting the barrels, the circuit comprising means for injecting a predetermined magnitude of current through a plurality of the interconnected barrels, the current having a magnitude sufficient to resistively heat the barrels so that they heat the adjacent substrate to a transition temperature at which the substrate undergoes a change of state from a solid to a semi-solid; and, means for measuring the resistance value of the interconnected barrels, a non-expected deviation of the measured resistance value from an expected resistance value being indicative of a defect in one or more of the barrels and/or their interconnections to the conductors.

Since the invention provides a method of destructive testing, it is preferable that it be applied to a coupon manufactured and processed in a manner exactly the same as the PCB itself. An assessment of the conductive circuitry on the coupon is thus a direct indication of the conductive circuitry reliability of the PCB itself.

BRIEF DESCRIPTION OF THE DRAWINGS

An embodiment of invention will be described in conjunction with the drawings in which.

DETAILED DESCRIPTION

Figure 1:
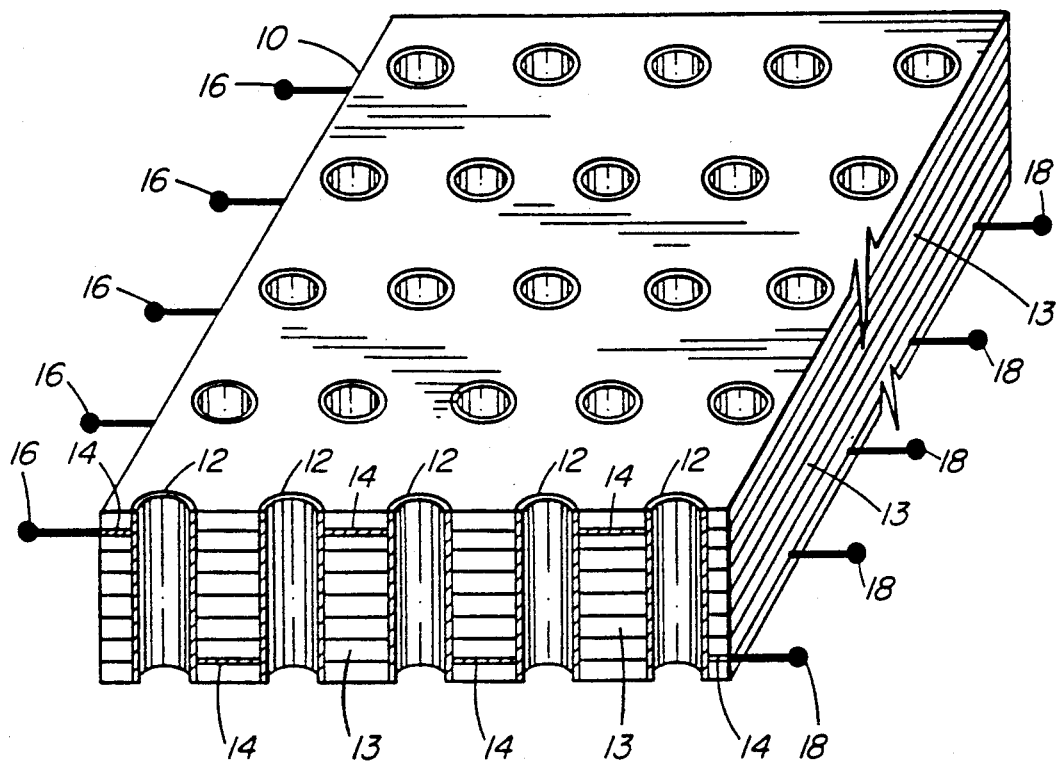
FIG. 1 is a sectional oblique view of a portion of a printed circuit board coupon showing conductive circuitry to be tested in accordance with the method of the invention.

In FIG. 1, a portion of a multilayer printed circuit board in the form of a test coupon 10 is shown having rows of plated-through a holes each comprising a plated conducting copper barrel lining a hole through the substrate layers 13 of glass epoxy. The conducting barrels 12 of each row are connected in series by printed conductors 14 provided on the upper and second to bottom layers of the coupon 10. Terminals 16 and 18 are provided at the respective end of each row for connecting to a current source and to instruments for measuring its resistance value.

Figure 2:
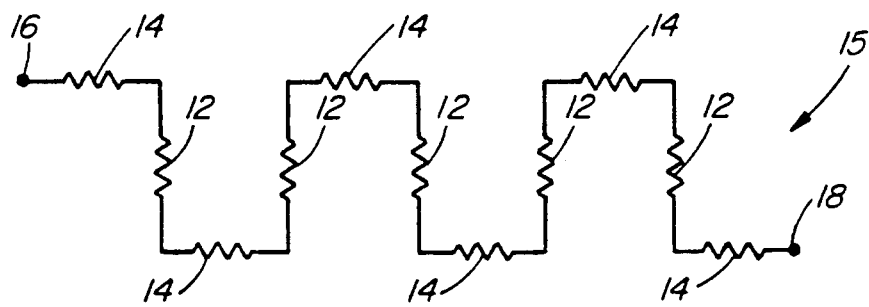
FIG. 2 is a circuit representation of a portion of the conductive circuitry shown in FIG. 1.

FIG. 2 shows a series circuit 15 corresponding to a row of interconnected PTHs of FIG. 1. The resistance of each barrel and the resistance of each connecting conductor 14 is represented by a resistor; the vertical resistors representing the barrel resistances and the horizontal resistors representing the track resistances.

Figure 3:
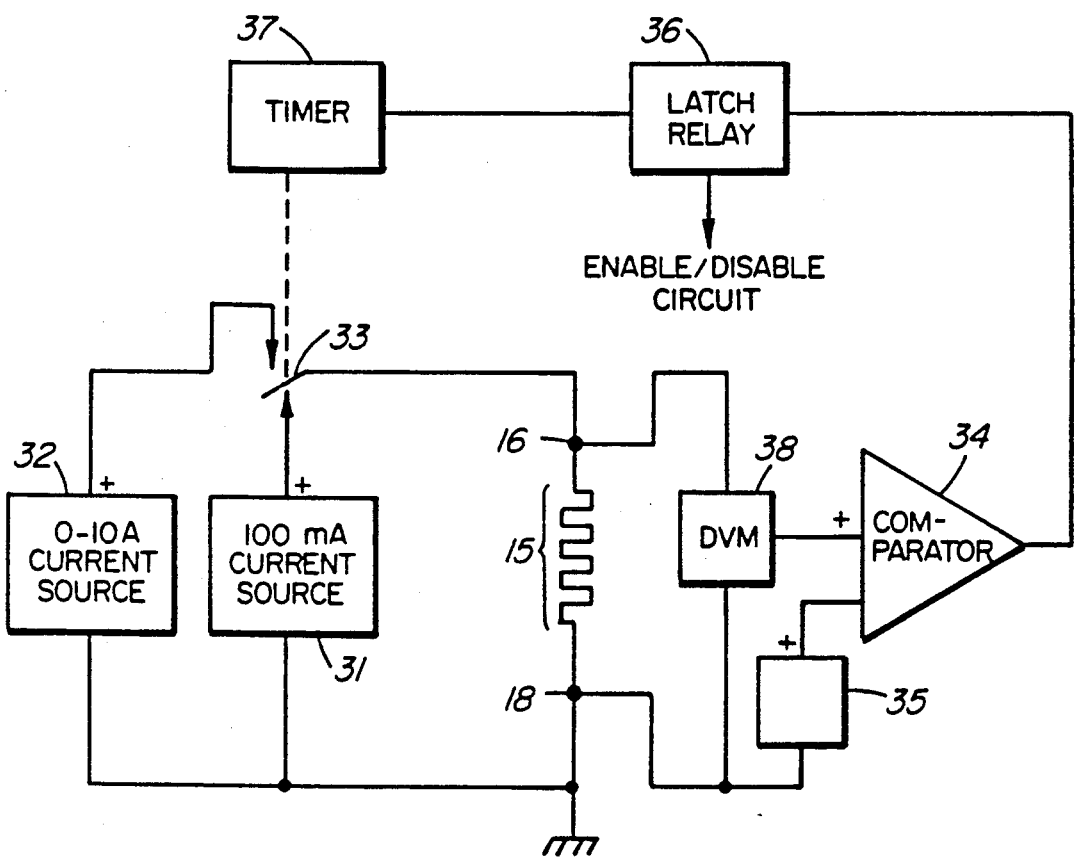
FIG. 3 is a block diagram of a power cycling test circuit in s accordance with the invention.

In FIG. 3, a terminal 16 at one end of the circuit 15 is switchably connected to a high intensity current source 31 capable of providing up to 10 A of current or to a low 100 mA current source 32 via a controllable switch 33 whereas terminal 18 is connected to ground. Connected across terminals 16 and 18 is a digital voltmeter 38 for measuring the resistance of the series of barrels 12. A comparator 34 coupled to the digital voltmeter and to a register 35 compares the measured voltage with a reference value stored in the register 35. If the comparison yields a non-expected result, a latch relay 36 is a responsive to the resultant output signal generated by the comparator 34 to provide a timer circuit 37 with a signal to terminate the test. Under normal circumstances before a fault is detected, the timer circuit 37 provides a signal to switch 33 at regular predetermined intervals for switching between the high and low intensity current sources. This s switching between current sources allows the circuit under test to heat up and to cool down thereby inducing thermal stress as discussed below.

Ohmic resistance heating is used to heat the copper of the barrels 12, interconnecting conductors 14 and the laminate material surrounding the barrels 12 to a temperature above the glass transition temperature of the laminate. Constant current of a few amperes is injected via the s high intensity current source 31 and the heat generated by power dissipation in the copper barrels is conducted radially outward to the glass fibers and epoxy resin of the substrate. Depending on the energy dissipated and the volume of material involved, the barrels 12 and the substrate 13 immediately surrounding them can be elevated to high temperature in a short time interval of 2-3 minutes. The timer circuit 37 then switches off the high intensity current source and the low intensity current source 32 is switched on; the resistance is measured and free air convention cools the laminate back to ambient temperature within 6-7 minutes. If the measured hot resistance is significantly greater than the expected resistance, the comparator generates a signal which terminates the test. The low intensity current source is applied to obtain a more accurate resistance measurement using the digital voltmeter 38.

Thus, a temperature cycling of the PTHs and the interconnecting tracks 14 can be achieved within 8-10 minutes through switching the circuit source on and off. The temperature attained by the elements of circuit 15 at the end of an "on" period can be accurately determined by using it as a resistance thermometer and measuring the hot resistance of copper taking into account the fact that the temperature coefficient of resistance (TCR) is approximately equal to 4000 ppm/°C.

In addition to inducing fatigue within the serial circuit 15 by thermal cycling, the circuit dynamically exercises the barrels 12 and interconnecting conductors 14. By doing so, it can precipitate any weaknesses or defects in the barrels 12 or interconnecting conductors 14 a to become open circuits or paths of high electrical resistance. An acceleration of barrel failure is due to the avalanching effect of the current cycling. The current causes intense localized heating of defect sites such as microcracks, voids, thin sections, or partial post cracks; these are seen as sources of high resistance. The resulting local stresses cause further deterioration of defects until they manifest themselves as open circuits at the high end temperature. So long as a barrel has plating with adequate ductility and tensile strength and uniform physical construction free of physical or process related flaws, it can withstand power cycling without prematurely developing microcracks and incipient local increases in resistance. Of course the barrels 12 ultimately fail after repeated temperature excursions when the fatigue life of copper is exceeded; for good quality barrels, this s occurs after several hundreds of power cycles.

TEST CONSIDERATIONS

Many PCBs manufactured today comprise a laminate of glass epoxy. In order to create significant Z axis expansion mismatch between the plated barrel and the surrounding glass epoxy (FR-4) the laminate needs to be elevated to a temperature just above the glass transition temperature of FR-4 material. For FR-4, this temperature ranges from 115° to 125° C. This is in consonance with MIL-STD-thermal cycling/shock test temperatures, where the high temperature limit is 125° C. It is thus necessary to heat the PTH barrels to at least 130° C. and cool them to ambient temperature.

In a daisy chained pattern of PCB conductive tracks and barrels, tracks contribute about 80% of the resistance while the plated barrels contribute about 20% of the resistance. Total resistance of a series of 100 daisy chained PTHs in a typical 90-mil thick, 8 layer board would be about 200 mΩ. With the passage of heating current through the daisy chained PTHs most of the heating takes place in the tracks. However, as the thermal conductivity of copper is far higher than that of the glass-epoxy laminate surrounding the copper, heat flows from the tracks into the barrels very quickly, thus raising the temperature of the barrels toward a higher equilibrium value.

For a typical test coupon of 100 PTHs on a 0.100-in pitch, in a 0.120-in thick 6 layer multilayer board interconnected with 0.030-in nominal width tracks on 1-oz copper in the first and the last inner layers (2 and 5), the loop resistance is about 200 mΩ. For this inner a temperature of 130° C. is reached within 3 minutes with a current of 5 to 6 amperes and is followed by a free air (about 25° C.) cooling period of 7 minutes after power is switched off. Thus a cycle time of 10 minutes may be achieved by switching on and off a current of 5-8A in test coupons with a total circuit resistance of 159-250 mΩ.

For a given set of coupons from the same production lot, the temperature attained could vary around 130° C. by a few degrees to ±5° C. due to variations of resistance among individual coupons; for a given coupon, the temperature attained is quite constant as all the heating parameters are fixed.

Typical powering currents required to achieve 130° C. in coupons of different types are given in the following:

| Loop Resistance (Ohms) | Powering Current (Amps) |
|---|---|
| 0.141 | 7.25 |
| 0.150 | 7.00 |
| 0.214 | 5.50 |
| 0.257 | 5.00 |

(The above values are for 0.120-in thick coupons.)

The operation of the test circuit shown in FIG. 3 is as follows: constant current (magnitude depending on the physical size and circuit electrical resistance of the test coupon) is switched on and off through the contacts of the synchronous flip-flop timer 37 and controllable switch 33. The on-off timings are fixed at 3 and 7 minutes respectively, for a 10 minute cycle.

During the off period, the change-over contact of the switch 33 connects the measuring current source 100 mA) through the circuit 15 between terminals 16 and 18. The voltage drop across the circuit being tested is continuously monitored (both during powering and measuring) by a digital voltmeter 38 connected to terminals 16 and 18. Thus a 4-wire resistance measurement is carried out to measure the temperature rise at the end of the on period.

The algorithm takes into account the temperature coefficient of resistance (TCR) of copper as 4000 ppm/°C. Thus if Rh is the hot resistance and $R_{25}$ the resistance at 25° C. measured initially at ambient, then the temperature attained at the end of an on period is given by the following:

$$T_h = (1.1 R_h - R_{25})/(0.004 R_{25})$$

At the onset of a failure, the current causes intense localized s heating of the failure site. Thermal runaway and possible burning and fusing of the defect site is prevented by the latch relay 36 which terminates the test by switching off the power source when a preset limit of hot resistance is exceeded. The limit is set at 150% of the initial hot resistance. At the onset of a failure when this limit is exceeded, the output signal of the comparator 34 trips the latch relay 36 and the test is terminated. Thus the power cycling is terminated at the first failure in the chain of PTHs and the number of cycles to failure is recorded on a counter.

An exemplary test procedure for a coupon having copper tracks connecting copper plated-through holes having a resistance of between 100 mΩ and 200 mΩ which can be implemented is as follows:

1) Connect the current source and the digital voltmeter (DVM) to the test coupon;
2) measure $R_{25}$ (room ambient) on the DVM;
3) estimate $R_h$ (for $T_h = 130°$ C.) from $T_h = (1.1 R_h - R_{25})/(0.004 R_{25})$;
4) use the following trial power current settings: 5A for 200-mΩ range, 6A for 150-mΩ range, 7A for 100-mΩ range of circuit resistance measured in step 2 (for standard 2-3 mm thick boards);
5) set control referent to $1.5 \times (\text{current} \times R_h)$
6) start cycling;
7) at the end of the first period, the DVM indicates actual $R_h$ (i.e., 100 mA × $R_h$);
8) if $R_h < R_{130}$, decrease current by 50 mA;
9) repeat steps 7) and 8) until $R_h$ approx = $R_{130}$;
10) if $R_h > R_{130}$, decrease current by 50 mA; and
11) repeat 7) and 10) until $R_h$ approx = $R_{130}$.

In summary, power cycling provides an inexpensive and relatively
fast temperature cycling test wherein its counterpart, the MIL-STD-202 standard benchmark temperature cycling test is a time consuming and expensive test to perform.

Numerous modifications and variations may be made to the invention without departing from the scope of the invention.

We claim:

1. A method of assessing the reliability of the conductive circuitry of a printed circuit board, the circuitry comprising plated a copper barrels lining the inside surface of through holes and conductors interconnecting the barrels, the method comprising the steps of:
    a) applying a current to a plurality of interconnected barrels, the current having a magnitude sufficient to resistively heat the barrels and their respective adjacent substrate to a temperature at which the substrate will undergo transition from a solid to a semi-solid;
    b) measuring the resistance value of the plurality of interconnected barrels; and
    c) comparing the measured resistance with an expected value of resistance, a non-expected result of the comparison being indicative that a defect is present in one or more of the plated barrels.

2. A method of assessing the reliability as defined in claim 1 wherein the expected value of resistance is $R_h$, and $R_h$ is derived from the equation $$T_h = (1.1 R_h - R_{25})/(0.004 R_{25}),$$

where $T_h$ is approximately equal to the transition temperature of the substrate, $R_{25}$ being the resistance at 25° C., and $R_h$ being the resistance at approximately the transition temperature.

3. A method of assessing the reliability as defined in claim 1 wherein the transition temperature defined in step (a) is approximately 130° C.

4. A method of assessing the reliability as defined in claim 1 wherein the ambient temperature is approximately 25° C.

5. A method of assessing the reliability as defined in claim 1 wherein the substrate is a laminate comprised of a plurality of layers of glass epoxy.

6. A circuit for assessing the reliability of the conductive circuitry of a PCB, the circuitry comprising plated copper barrels lining the inside surface of through holes and conductors interconnecting the barrels, the circuit comprising:
    means for injecting a predetermined magnitude of current through a plurality of the interconnected barrels, the current having a magnitude sufficient to resistively heat the barrels so that they heat their respective adjacent substrate to a transition temperature at which the substrate undergoes a change of state from a solid to a semi-solid;
    means for measuring the resistance of the interconnected barrels, a non-expected deviation of the measured resistance value from an expected resistance value being indicative of a defect in one or more of the barrels and/or their interconnections to the conductors;

means for periodically switching the current injecting means on and off for predetermined durations of time, the switching on of the current injecting means being for a time suitable to allow resistance heating of the conductive barrel and to allow heating of the adjacent substrate to a temperature at which the transition will occur, the switching off of the current injection means being at least for a time suitable to allow the substrate to reach ambient temperature and return to a solid;

means for comparing the measured resistance value with a predetermined resistance value; and means responsive to the comparing means for terminating the injection of current when the value of the measured resistance exceeds the value of the predetermined resistance by a predetermined amount.

7. A method for assessing the reliability of the conductive circuitry of a PCB, the circuitry comprising plated copper barrels lining the inside surface of through holes and conductors interconnecting the barrels, the method comprising the steps of:

injecting a predetermined magnitude of current through a plurality of the interconnected barrels, the current having a magnitude sufficient to resistively heat the barrels so that they heat their respective adjacent substrate to a transition temperature at which the substrate undergoes a change of state from a solid to a semi-solid;

measuring the resistance of the interconnected barrels, a non-expected deviation of the measured resistance value form an expected resistance value being indicative of a defect in one or more of the barrels and/or their interconnections to the conductor;

periodically switching the current injecting means on and off for predetermined durations of time, the switching on of the current injecting means being for a time suitable to allow resistance heating of the conductive barrel and to allow heating of the adjacent substrate to a temperature at which the transition will occur, the switching off of the current injection means being at least for a time suitable to allow the substrate to reach ambient temperature and return to a solid;

comparing the measured resistance value with a predetermined resistance value; and terminating the injection of current when the value of the measured resistance exceeds the value of the predetermined resistance by a predetermined amount.

* * * * *